United States Patent [19]
Kitamura et al.

[11] 3,962,642
[45] June 8, 1976

[54] CHANNEL INDICATOR DEVICE

[75] Inventors: Nobuo Kitamura, Sagamihara; Takao Mogi, Tokyo, both of Japan

[73] Assignee: Sony Corporation, Tokyo, Japan

[22] Filed: June 14, 1974

[21] Appl. No.: 479,557

[30] Foreign Application Priority Data
June 18, 1973 Japan.......................... 48-71916[U]

[52] U.S. Cl.................................. 325/455; 334/86
[51] Int. Cl.²............................................ H04B 1/06
[58] Field of Search.................... 325/455, 461, 465; 334/1–3, 33, 36–37, 86–87; 178/5.8; 200/11 DA, 11 TW

[56] References Cited
UNITED STATES PATENTS

| | | | |
|---|---|---|---|
| 3,428,021 | 2/1969 | Kuhl et al. | 325/455 X |
| 3,531,603 | 9/1970 | Ashman | 200/11 TW |
| 3,671,869 | 6/1972 | Wolfram | 325/455 |
| 3,812,285 | 3/1973 | Miyata et al. | 325/455 X |

*Primary Examiner*—Robert L. Griffin
*Assistant Examiner*—Robert Hearn
*Attorney, Agent, or Firm*—Lewis H. Eslinger; Alvin Sinderbrand

[57] ABSTRACT

A channel indicator device is disclosed in which a tuner for achieving station selection between VHF and UHF band television broadcastings is provided in association with a single channel selection shaft of the tuner, a switch for band selection is also provided in connection with the channel selection shaft, and an indicator in the type of a plural-unit indication is provided, the indicator having a numeral corresponding to a selected channel in response to the channel selection and a code corresponding to a selected one of the VHF and UHF bands. The indicator has provided with a plural-unit indication member consisting of a plurality of indication elements to form a numeral "8".

3 Claims, 6 Drawing Figures

3,962,642

CHANNEL INDICATOR DEVICE

BACKGROUND OF THE INVENTION

1. Field of the Invention

The present invention relates generally to a channel indicator device, and more particularly is directed to the channel indicator device indicating not only the channel number selected by a tuner knob but also the band either VHF or UHF television broadcasting band.

2. Description of the Prior Art

A channel indicator device has been proposed for use with a television receiver having a tuner in which VHF and UHF bands are switched with one selection shaft of the tuner. The prior art channel indicator device is provided around the channel selection shaft and its channel indication is viewed through a window formed in its part, or numerals for the indication of selected channels are provided around a channel knob fixed on the shaft. With such a prior art channel indicator device, since the number of broadcasting stations which may be received is numerous too many, i.e., 12 channels in VHF band and further at least 8 channels in UHF band in big cites at least 20 channels accordingly, the channel indication numerals become small in demension, and, especially, the channel indication is difficult to be viewed when a user sits far from the television receiver.

SUMMARY OF THE INVENTION

According to the present invention there is provided a channel indicator device in which a tuner for achieving station between VHF and UHF band television broadcastings is provided in association with a single channel selection shaft, a switch for band selection is provided in connection with the single channel selection shaft, and an indicator in the type of a plural-unit indication is provided, the indicator having a numeral corresponding to a selected channel in response to the channel selection and a code corresponding to a selected one of the VHF and UHF band television broadcastings. The indicator has provided with a plural-unit indication member consisting of a plurality of indication elements to form at least a two-divided square.

It is an object of the present invention to provide a channel indicator device free from the defects encountered in the prior art.

It is another object of the present invention to provide a channel indicator device which can show a selected channel positively and brightly.

It is a further object of the present invention to provide a channel indicator device suitable for use with a television receiver.

The additional and other objects, features and advantages of the present invention will become apparent from the following description taken in conjunction with the accompanying drawing.

DESCRIPTION OF THE PREFERRED EMBODIMENT

An embodiment of the present invention will be hereinafter described with reference to the drawings.

Figure 1:
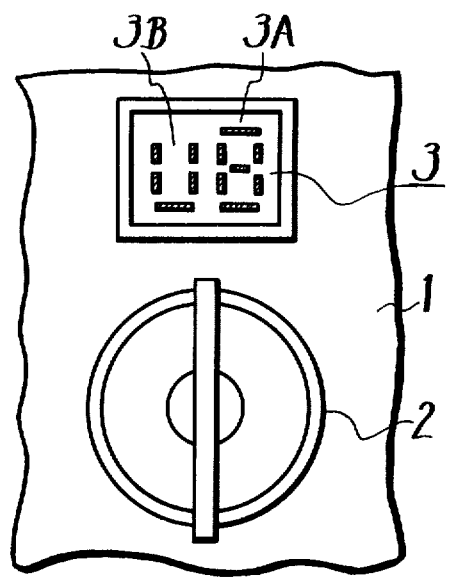
FIG. 1 is a partial front view showing an embodiment of the channel indicator device according to the present invention.
Figure 4:
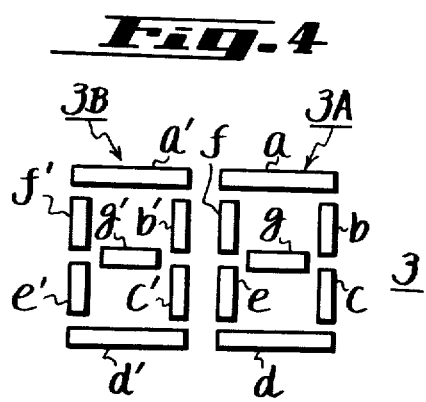
FIG. 4 is a cross-sectional view showing an arrangement of indication elements used in the channel indicator device of the present invention.
Figure 2:
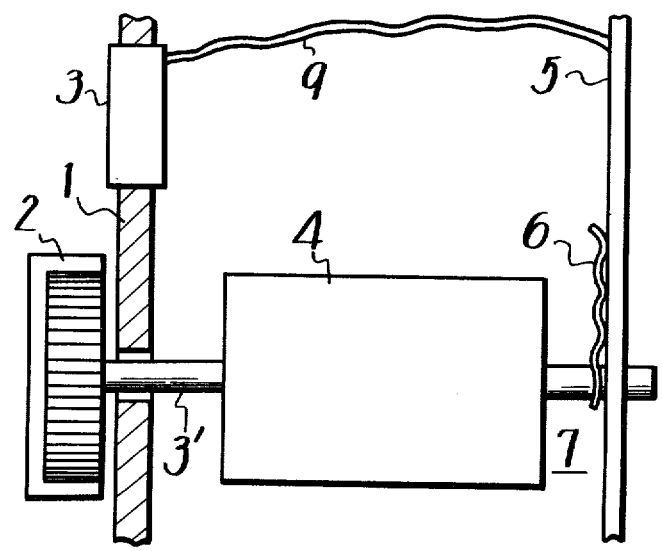
FIG. 2 is its cross-sectional view.
Figure 3A:
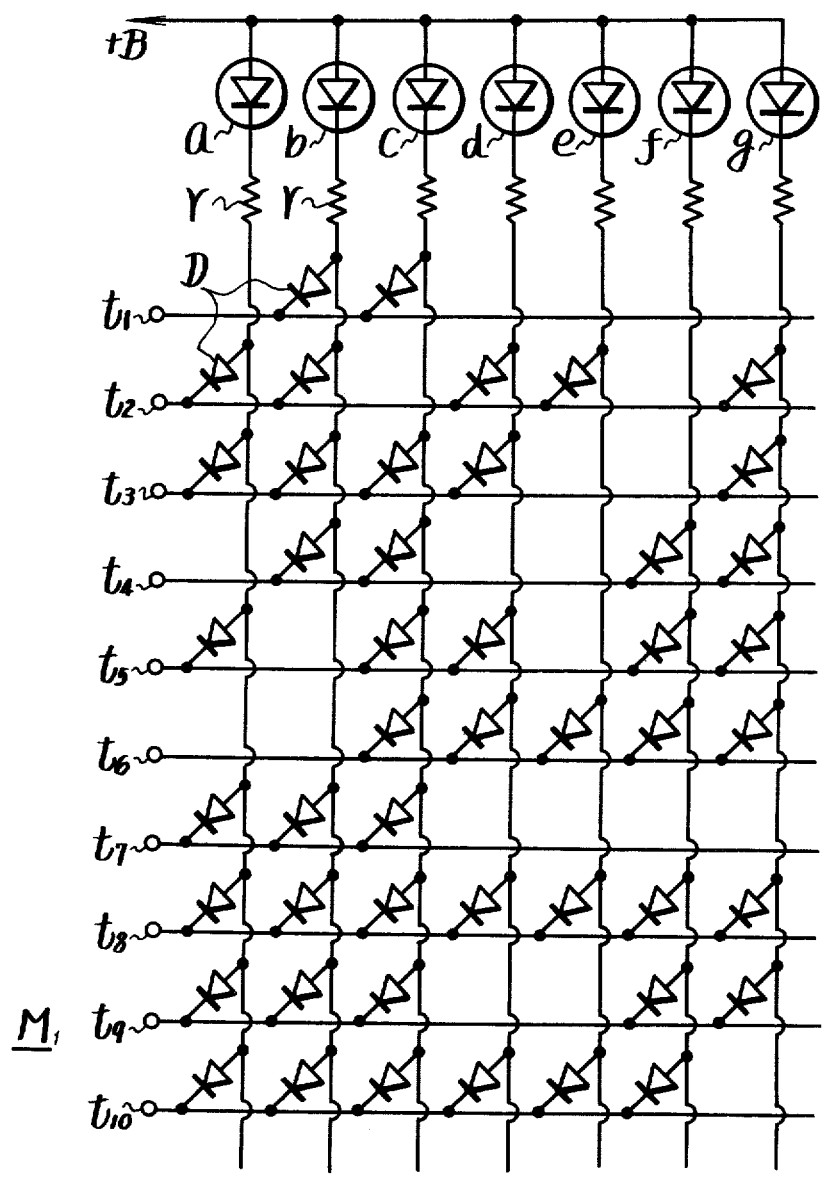
FIGS. 3A and 3B are its connection diagrams.
Figure 3B:
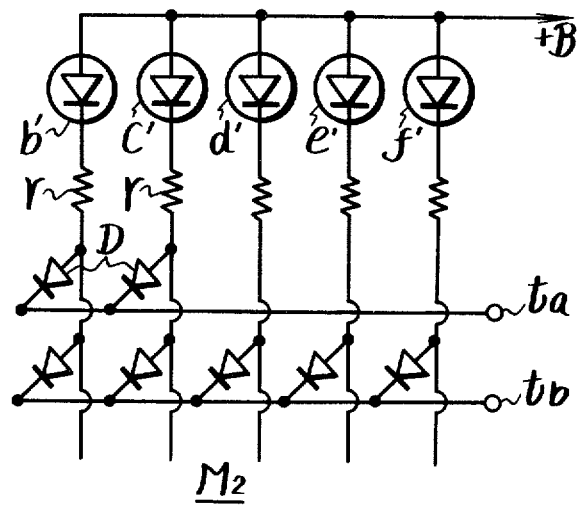
Figure 3C:
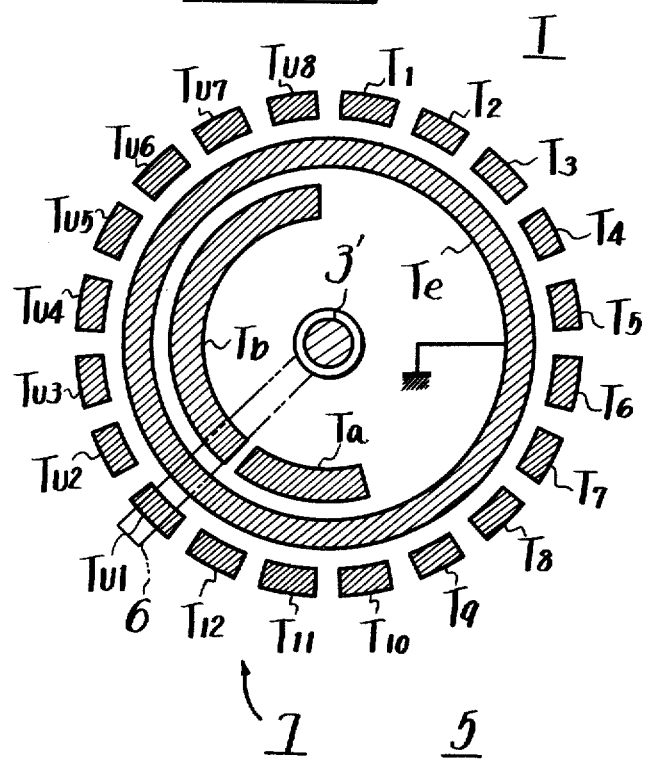
FIG. 3C is a front view of a switch for channel selection.

FIG. 1 shows a part of the front panel of a television receiver which is provided with the channel indicator device according to the invention, FIG. 2 shows its cross-section view, FIG. 3 shows a practical circuit diagram of a switch for channel change used in the present invention, and FIG. 4 shows the arrangement of indication elements of the indicator device.

A description will be now given with reference to FIGS. 1 and 2. In the FIG. reference numeral 1 represents a front panel of the television receiver in which the channel indicator device of the invention is employed and 2 a channel selection knob which is mounted on a channel selection shaft 3'. A VHF and UHF tuner 4 is provided in connection with the channel selection shaft 3' to be changed over in accordance with the rotation of the shaft 3'.

The illustrated embodiment is the case where 1 to 12 channels of VHF band television broadcasting may be received and 1 to 8 channels of UHF band television broadcasting may be received locally (in this case, however, the channels are not actual UHF band channels themselves but the channels which can be received in local are converted and corresponded to the numbers 1 to 8). Accordingly, in the illustrated embodiment the indicator 3 consists of a unit indication member 3A for one unit and unit indication member 3B for ten unit and the code "U" for UHF band. The respective unit indication members 3A and 3B consist of indication elements $a, b, c, d, e, f, g$ and $a', b', c', f', g'$ each group of which forms a two-divided square or a numeral "8" (refer to FIG. 4). The indication elements $a$ to $g$ and $a'$ to $g'$ are luminescent diodes in the illustrated embodiment. The indication elements $a'$ and $g'$ in the unit indication member 3B are not used in order to display the code "U".

A switch 7 for channel selection will be now described in FIG. 3-C. The switch 7 consists of a contact group T (refer to FIG. 3) formed on a printed board 5 provided at the inner side end portion of the channel selection shaft 3', and a sliding or rotatable contact member 6 attached to the shaft 3' to make a short-circuit with the contact group T. As shown in FIG. 3, the contact group T consist of a ring-shaped contact Te which is grounded, twenty fixed contacts $T_1$ to $T_2$ and $T_{U1}$ to $T_{U8}$ arranged with an equal angular distance around the ring-shaped contact Te at its outside, the fixed contacts $T_1$ to $T_{12}$ being for the indication of one unit of the channel or the numerals of the VHF, and the fixed contacts $T_{U1}$ to $T_{U8}$ being for the indication of the numerals of the UHF, a fixed contact Ta arranged at the inside of the ring-shaped contact Te and having an angular length corresponding to the fixed contacts $T_{10}$ to $T_{12}$ for the indication of ten unit numeral of the UHF, and a fixed contact Tb at the inside of the ring-shaped contact Te and having an angular length corresponding to the fixed contacts $T_{U1}$ to $T_{U8}$ for the indication of the code "U" of the UHF band television broadcasting. The sliding contact member 6 is formed to connect the fixed contacts $T_1$ to $T_{12}$, $T_{U1}$ to $T_{U8}$ arranged coaxially with the ring-shaped contact Te and the fixed contacts Ta and Tb sequentially for short-circuiting in association with the switching of the tuner 4 caused by the rotation of the channel selection shaft 3'.

In order to emit lights from the indication elements forming the unit indication members 3A and 3B of the indicator device 3 in association with the change over switch 7, driving circuits such as diode matrices $M_1$ and $M_2$ are formed on the printed board 5, respectively. The diode matrix $M_1$ consists of diodes D connected as shown in FIG. 3-A. Therminals $t_1$ to $t_{10}$ of the diode matrix $M_1$ are led out from the respective row lines which are connected to the respective contacts of the switch 7. That is, the terminal $t_1$ is connected to the contacts $T_1$, $T_{11}$ and $T_{t1}$; the terminal $t_2$ to the contacts $T_2$, $T_{12}$ and $T_{t2}$; the terminal $T_3$ to the contacts $T_3$ and $T_{t3}$; the terminal $t_4$ to the contacts $T_4$ and $T_{t4}$; the terminal $t_5$ to the contacts $T_5$ and $T_{t5}$; the terminal $t_6$ to the contacts $T_6$ and $T_{t6}$; the terminal $t_7$ to the contacts $T_7$ and $T_{t7}$; the terminal $t_8$ to the contacts $T_8$ and $T_{t8}$; the terminal $t_9$ to the contacts $T_9$; and the terminal $t_{10}$ to the contact $T_{10}$, respectively. The column lines of the diodes matrix $M_1$ are connected through resistors r to one ends of the luminescent diodes a to g as indicating elements of the indication member 3A, respectively, while the other ends of the luminescent diodes a to g are connected together to a voltage source +B.

The other diode matrix $M_2$ consists of a number of diodes D as shown in FIG. 3-B from the two row lines of which terminals $t_a$ and $t_b$ are led out. The terminals $t_a$ and $t_b$ are connected to the contacts Ta and Tb of the switch 7, respectively, while the column lines are connected through resistors r to one ends of the luminescent diodes b' to f', respectively, the other ends of which are connected together to the voltage source +B. The diode matrices $M_1$ and $M_2$ are constructed such that, in each of the unit indicator members 3A and 3B of the indicator device 3, the VHF broadcasting channels 1 to 12 and the UHF broadcasting channels U1 to U8 are indicated in accordance with the switching of the switch 7. In FIG. 2, reference numeral 9 indicates a wire group which connect the circuits on the printed board 5 with the indicator device 3.

With the channel indicator device of the invention described as above, if the channel changing knob 2 is rotated to achieve the channel selection either the VHF or UHF band can be indicated and also selected one of the channels 1 to 12 and U1 to U8 is indicated in the indicator device 3. In this case, the indicator device 3 can be formed great in size even near the knob 2 and bright to be seen clearly from a position far from the device 3.

With the present invention described as above, the tuner which carries out the station selection of the VHF and UHF band television broadcastings is formed on the single channel selection shaft, the switch for channel selection is provided in connection with the single channel selection shaft, the indicator device with the type of plural-unit indication is provided for indicating a numeral corresponding to a selected channel in response to the switching of the switch and a code corresponding to a selected one of the VHF and UHF bands, the change over switch comprises the fixed contacts for the numeral change and the fixed contacts for the code change, and the indicator device comprises the plural-unit indication members which consist of seven elements arranged as a numeral "8" or two-divided form as a whole, so that the channel indication can be carried out clearly even if the channel number is greater.

Accordingly, the present invention is suitable for the TV receiver remotely controlled. Further, even if the number of channels to be received is great, such as channel 88 or 96 in UHF band, the device of the invention is enough with simple construction and small numerals less than 9.

In the illustrated embodiment, the unit indicator member consists of seven elements forming the pattern on FIG. "8", but it may consist of twelve elements forming a four-divided square or a square divided by a cross therein into four squares.

It may be apparent that many modifications and variations could be made by those skilled in the art without departing from the spirits and scope of the novel concepts of the invention.

We claim as our invention:

1. A channel indicator device comprising:
   A. a rotary shaft connected to a tuner and having a first plurality of angular positions corresponding to channel settings of VHF channels having single-digit numbers, a second plurality of angular positions corresponding to channel settings of VHF channels having two-digit numbers, and a third plurality of angular positions corresponding to UHF chanel settings that have been assigned single-digit numbers;
   B. first and second multi-segment numeric indicators;
   C. a rotary switch comprising:
      1. a first array of contacts equal in number to the total number of said positions,
      2. an arm to contact a respective one of said contacts in each of said positions,
      3. a first multi-position contact to be contacted by said arm over each of said second plurality of positions,
      4. a second multi-position contact to be contacted by said arm over each of said third plurality of positions, and
      5 a third multi-position contact connected to one terminal of a power supply and being contacted by said arm in each of said total number of positions; and
   D. matrix circuit means connected to each of said first array of contacts and connected to said first indicator to connect selected segments of said first indicator to said power source by said arm and said third multi-position contact to energize the UNITS number of each of said VHF and UHF channel settings, said matrix circuit means being connected to said first multi-position contact and connected to said second indicator to connect selected segments of said second indicator to said power source by said arm and said third multi-position contact to energize the TENS number of each of said VHF channel settings having a multi-digit number, and said matrix circuit means being connected to said second multi-position contact and connected to said second indicator to connect selected segments of said second indicator to said power source to energize a symbol indicative of the angular position of said shaft as being with the range of said UHF settings.

2. The channel indicator device of claim 1 in which said arm short-circuits said first multi-position contact to said third multi-position contact and to those contacts of said first array angularly aligned with said first multi-position contact in said second plurality of positions and short-circuits said second multi-position contacts to said third multi-position contact and to those contacts of said first array aligned with said second multi-position contact in said third plurality of positions.

3. The channel indicator device of claim 1 in which said matrix circuit means comprises:

A. a first matrix circuit connected to each contact of said first array and to said first indicator; and B. a second matrix circuit connected to said first and second multi-position contacts and to only selected segments of said second indicator.

* * * * *